(12) United States Patent
Arai

(10) Patent No.: US 8,269,225 B2
(45) Date of Patent: Sep. 18, 2012

(54) LIGHTING DEVICE

(75) Inventor: Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/271,565

(22) Filed: Oct. 12, 2011

(65) Prior Publication Data

US 2012/0119251 A1     May 17, 2012

Related U.S. Application Data

(63) Continuation of application No. 12/564,089, filed on Sep. 22, 2009, now Pat. No. 8,143,629, and a continuation of application No. 11/120,999, filed on May 4, 2005, now Pat. No. 7,692,199.

(30) Foreign Application Priority Data

May 21, 2004    (JP) ................................. 2004-152365

(51) Int. Cl.
     *H01L 27/15*      (2006.01)
(52) U.S. Cl. ................ 257/79; 257/13; 257/80; 257/82; 257/89; 257/93; 257/777; 257/778; 257/E33.054; 257/E25.028; 257/E25.032
(58) Field of Classification Search .................... 257/79, 257/13, 80, 82, 89, 93, 777, 778, E33.054, 257/E25.028, E25.032
See application file for complete search history.

(56) References Cited

U.S. PATENT DOCUMENTS

| | | | |
|---|---|---|---|
| 5,369,289 A * | 11/1994 | Tamaki et al. ................. | 257/99 |
| 5,421,908 A | 6/1995 | Yoshida et al. | |
| 5,905,275 A | 5/1999 | Nunoue et al. | |
| 6,157,127 A | 12/2000 | Hosokawa et al. | |
| 6,208,791 B1 | 3/2001 | Bischel et al. | |
| 6,320,633 B1 | 11/2001 | Broer et al. | |
| 6,538,374 B2 | 3/2003 | Hosokawa | |
| 6,593,691 B2 | 7/2003 | Nishi et al. | |
| 6,608,449 B2 | 8/2003 | Fukunaga | |
| 6,630,785 B1 * | 10/2003 | Lu ................................. | 313/505 |
| 6,781,162 B2 | 8/2004 | Yamazaki et al. | |
| 6,853,011 B2 | 2/2005 | Lin | |
| 6,885,030 B2 | 4/2005 | Onozuka et al. | |

(Continued)

FOREIGN PATENT DOCUMENTS

JP      06-342924      12/1994

(Continued)

*Primary Examiner* — Marc Armand
(74) *Attorney, Agent, or Firm* — Eric J. Robinson; Robinson Intellectual Property Law Office, P.C.

(57) ABSTRACT

An object of the invention is to provide a lighting device which can suppress luminance nonuniformity in a light emitting region when the lighting device has large area. A layer including a light emitting material is formed between a first electrode and a second electrode, and a third electrode is formed to connect to the first electrode through an opening formed in the second electrode and the layer including a light emitting material. An effect of voltage drop due to relatively high resistivity of the first electrode can be reduced by electrically connecting the third electrode to the first electrode through the opening.

42 Claims, 12 Drawing Sheets

U.S. PATENT DOCUMENTS

| | | |
|---|---|---|
| 7,074,669 B2 | 7/2006 | Iijima et al. |
| 7,116,044 B2 | 10/2006 | Fukunaga |
| 7,402,945 B2 | 7/2008 | Yamazaki et al. |
| 7,692,199 B2 | 4/2010 | Arai |
| 7,733,441 B2 | 6/2010 | Seo et al. |
| 7,956,349 B2 | 6/2011 | Tsutsui et al. |
| 2001/0035393 A1 | 11/2001 | Lu et al. |
| 2002/0130615 A1 | 9/2002 | Saito et al. |
| 2003/0189401 A1 | 10/2003 | Kido et al. |

FOREIGN PATENT DOCUMENTS

| | | |
|---|---|---|
| JP | 07-094285 A | 4/1995 |
| JP | 2002-033198 | 1/2002 |
| JP | 2002-280167 A | 9/2002 |
| JP | 2004-134282 | 4/2004 |
| JP | 2006-019251 | 1/2006 |

* cited by examiner

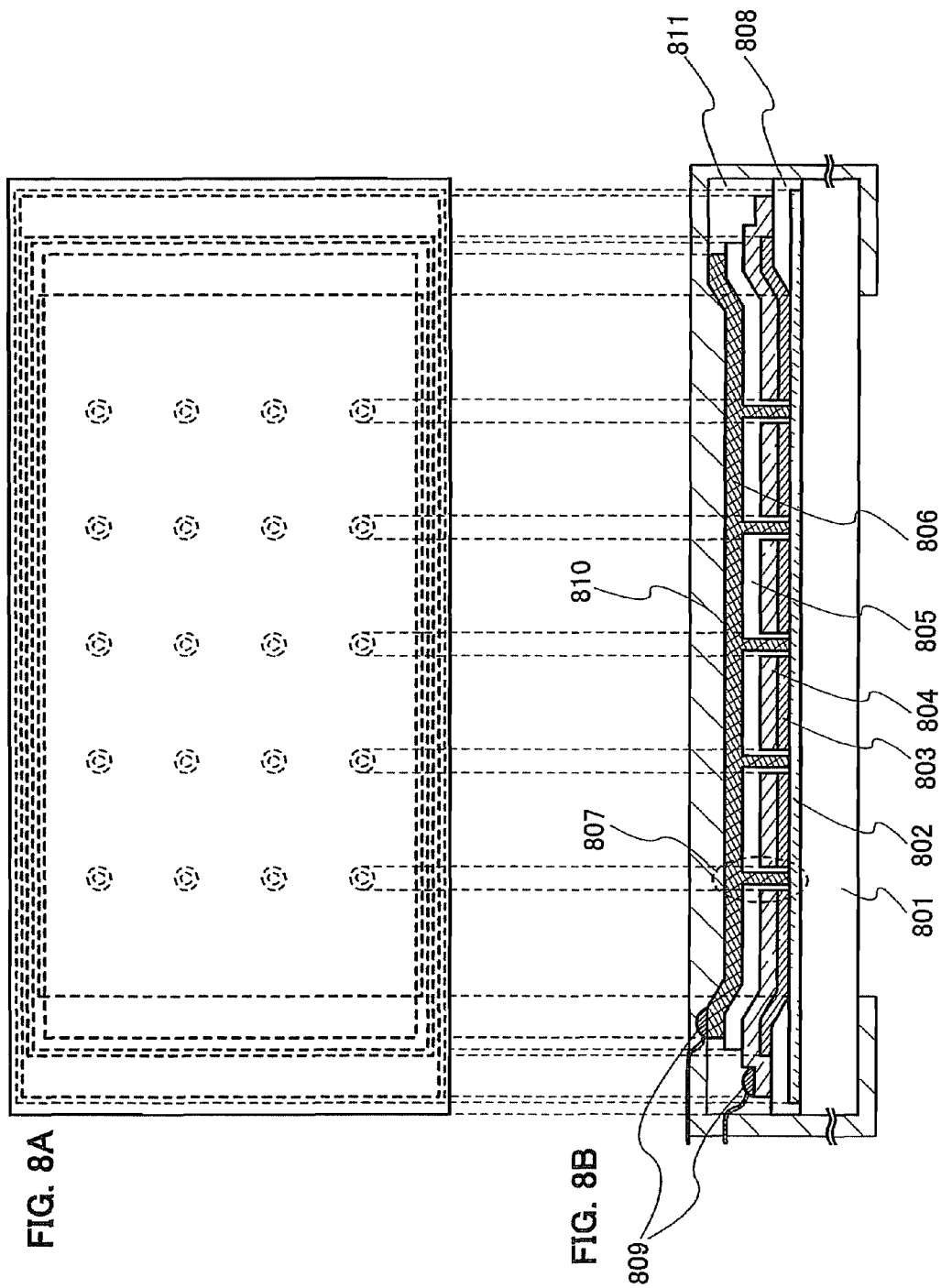

LIGHTING DEVICE

BACKGROUND OF THE INVENTION

1. Field of the Invention

The present invention relates to a lighting device using a light emitting element.

2. Description of the Related Art

A light emitting element is a self light emitting element and is attempted to be used as a lighting device. The light emitting element is a surface-emitting body, and a lighting device capable of emitting near-natural light can be obtained by using the light emitting element for lighting.

The light emitting element has an anode, a cathode, and a layer including a light emitting material which provides luminescence (Electroluminescence) by applying an electric field thereto. A hole injected from the anode is combined with an electron injected from the cathode in the layer including a light emitting material, thereby obtaining luminescence. Luminescence obtained from the layer including a light emitting material includes luminescence (fluorescence) that is obtained in returning from a singlet excited state to a ground state and luminescence (phosphorescence) that is obtained in returning from a triplet excited state to a ground state.

In a light emitting device using such a light emitting element, an electrode in the direction of light emission needs to be transparent. However, a transparent conductive film which is typically used as a transparent electrode often has relatively high resistivity, and voltage drop is caused in a portion away from a current supply terminal. Specifically, the lighting device is often intended to emit light from the entire surface at the same luminance; therefore, in-plane nonuniformity of luminance becomes further noticeable.

When the lighting device has large area, luminance is lowered in a portion through which current is hard to flow. In other words, luminance is nonuniform in a light emitting region of the lighting device. An ITO electrode typically used as the anode has higher electrical resistance than that of metal such as Al used as the cathode. Therefore, voltage drop is caused in a portion away from a current supply terminal, which results in low luminance. In order to solve the problem, Reference 1 reports a structure in which at least a portion of an anode is provided with an auxiliary electrode having lower electrical resistance than that of the anode (Reference 1: Japanese Patent Laid-Open No. 2004-134282).

In Reference 1, an auxiliary electrode is provided on a long side or a short side of a light emitting element. When the lighting device has larger area, luminance is lowered in a portion away from the auxiliary electrode (for example, in a central portion of the lighting device). However, the auxiliary electrode can only be partly provided, because light emitted from a light emitting layer cannot be extracted outside when the auxiliary electrode is entirely provided on the anode in the structure of Reference 1.

Since the lighting device is often intended to emit light from the entire surface at the same luminance, nonuniformity of luminance becomes further noticeable.

SUMMARY OF THE INVENTION

In view of the above-described problem, it is an object of the invention to provide a lighting device having favorable luminance uniformity in a light emitting region when the lighting device has large area.

One feature of a lighting device of the invention is that a layer including a light emitting material is formed between a first electrode and a second electrode, and a third electrode is formed to connect to the first electrode through an opening formed in the second electrode and the layer including a light emitting material.

In other words, the lighting device has a layer including a light emitting material and a second electrode between a first electrode and an auxiliary electrode; the auxiliary electrode is formed opposite to the first electrode with the second electrode therebetween; and the first electrode is electrically connected to the auxiliary electrode through an opening formed in the second electrode and the layer including a light emitting material. Note that the first electrode and the second electrode need to be electrically insulated from each other and the second electrode and the auxiliary electrode need to be electrically insulated from each other.

More specifically, another feature of the invention is that a layer including a light emitting material provided with a first opening and a second electrode provided with a second opening are arranged over a first electrode formed of a transparent conductive film so that the second opening overlaps the first opening; and an insulating layer formed over the second electrode, covering the first opening, the second opening, and the side of the second opening, and provided with a third electrode to expose the first electrode and a third electrode formed over the insulating layer to be in contact with the first electrode through the first to third openings are formed.

Another feature of the invention according to the above structure is that a plurality of openings is formed in a light emitting region of a lighting device.

In the above structure, light emitted from the layer including a light emitting material is emitted from the first electrode side. In other words, the first electrode transmits light and is formed of a transparent conductive film. Specifically, indium tin oxide (hereinafter referred to as ITO), indium tin oxide containing silicon, indium oxide containing zinc oxide (ZnO) of 2% to 20%, or the like can be used.

Note that a low-resistivity material is preferably used as the auxiliary electrode. An effect of voltage drop due to relatively high resistivity of the first electrode can be reduced by using a low-resistivity material.

In the above structure, the layer including a light emitting material may have a laminated structure of a plurality of layers each including a light emitting material.

Further in the above structure, a substrate for supporting the lighting device may be a flexible substrate.

In the above structure, no light is lost except in a connection portion of the auxiliary electrode and the first electrode because the auxiliary electrode is not placed in the direction of light emission. Therefore, a material, a thickness, or a formation position of the auxiliary electrode can be freely set.

In the case where the area of the connection portion of the auxiliary electrode and the first electrode is sufficiently small, the presence of the auxiliary electrode can be, for the most part, disregarded even when seen from the side of light emission. Therefore, a plurality of openings can be formed in a light emitting region of the lighting device.

According to the invention, a lighting device having favorable in-plane uniformity of luminance can be obtained. Since an auxiliary electrode is not placed in the direction of light emission, little light is lost due to the auxiliary electrode, and a material, a thickness, or a formation position of the auxiliary electrode can be freely set.

BRIEF DESCRIPTION OF DRAWINGS

FIGS. 8A and 8B are a top view and a cross-sectional view of a lighting device of the present invention, respectively.

DETAILED DESCRIPTION OF THE INVENTION

Embodiment modes of the present invention are described in detail with reference to drawings. However, the present invention is not limited to the following description. As is easily known to a person skilled in the art, the mode and the detail of the invention can be variously changed without departing from the purpose and the scope of the present invention. Thus, the present invention is not interpreted while limiting to the following description of the embodiment modes.

Embodiment Mode 1

Figure 1A:
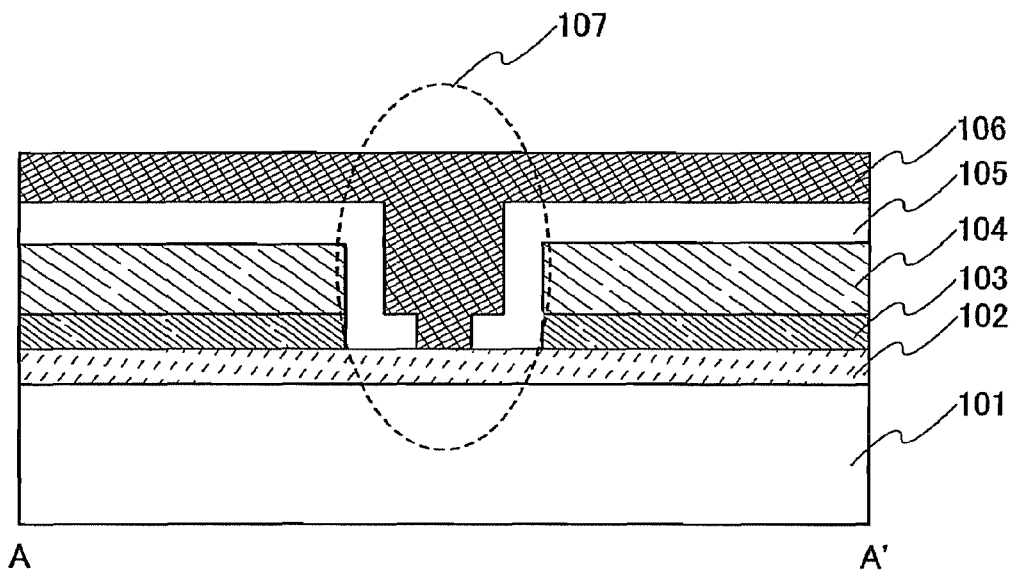
FIGS. 1A and 1B are a cross-sectional view and a top view of a light emitting region in a lighting device of the present invention, respectively.
Figure 1B:
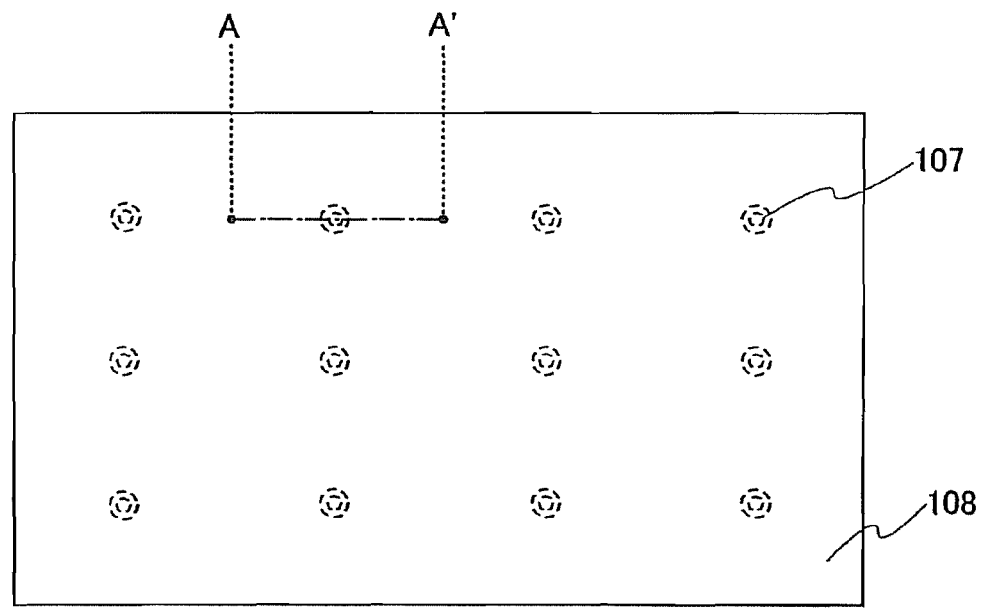

A structure of a lighting device of the invention is described with reference to FIGS. 1A and 1B. A lighting device shown in FIGS. 1A and 1B is a bottom emission lighting device which emits light from a substrate side. Note that FIG. 1B is a top view of a light emitting region in a lighting device of the invention and FIG. 1A is a cross-sectional view (taken along line A-A' in FIG. 1B) of the vicinity of an opening in the light emitting region.

In FIGS. 1A and 1B, a light transmitting substrate is used as a substrate 101. Specifically, a light transmitting material such as glass, plastic, polyester resin, or acrylic resin can be used. The substrate 101 may be flexible.

A transparent conductive film is formed over the substrate 101 as a first electrode 102. For example, indium tin oxide (hereinafter referred to as ITO), indium tin oxide containing silicon, indium oxide containing zinc oxide (ZnO) of 2% to 20%, or the like can be used for the transparent conductive film.

Figure 11:
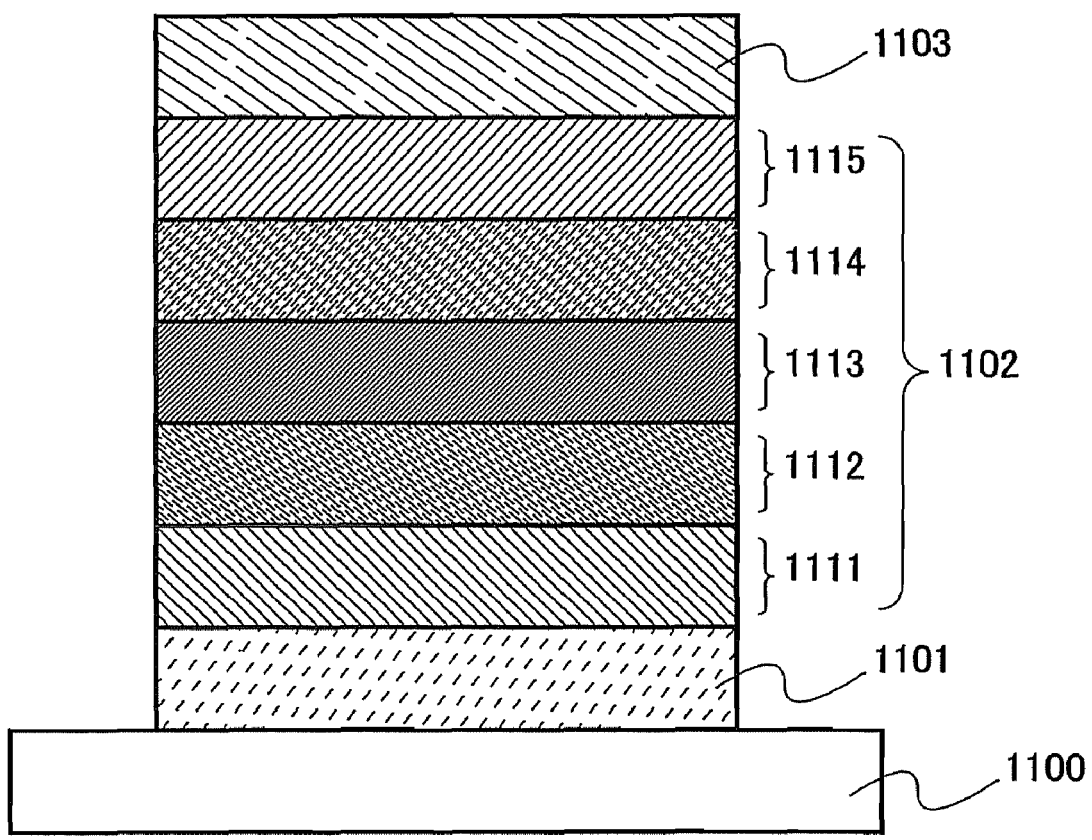
FIG. 11 shows an example of a layer including a light emitting material in a lighting device of the present invention.

A layer including a light emitting material 103 is formed over the first electrode 102. A known material can be used for the layer including a light emitting material 103, and either a low molecular weight material or a high molecular weight material can be used. A material for forming the layer including a light emitting material may include not only the one formed of only an organic compound material but also the one partly containing an inorganic compound. The layer including a light emitting material is formed by appropriately combining a hole injection layer, a hole transport layer, a hole blocking layer, a light emitting layer, an electron transport layer, an electron injection layer, or the like. The layer including a light emitting material may be a single layer or have a laminated structure of a plurality of layers. FIG. 11 shows an example of a structure in which the layer including a light emitting material includes a hole injection layer, a hole transport layer, a light emitting layer, an electron transport layer, and an electron injection layer. In FIG. 11, a first electrode (anode) 1101, a layer including a light emitting material 1102, and a second electrode (cathode) 1103 are formed over a substrate 1100. The layer including a light emitting material 1102 includes a hole injection layer 1111, a hole transport layer 1112, a light emitting layer 1113, an electron transport layer 1114, and an electron injection layer 1115. Note that the layer including a light emitting material in a lighting device of the invention is not limited to the structure of FIG. 11. Hereinafter, described is a specific material used for the hole injection layer, the hole transport layer, the light emitting layer, the electron transport layer, and the electron injection layer.

As a hole injection material for forming the hole injection layer, a porphyrin-based compound is effective among other organic compounds, and phthalocyanine (hereinafter referred to as $H_2$-Pc), copper phthalocyanine (hereinafter referred to as Cu-Pc), or the like can be used. Further, a chemically doped high molecular weight conductive compound can be used, such as polyethylene dioxythiophene (hereinafter referred to as PEDOT) doped with polystyrene sulfonate (hereinafter referred to as PSS). A benzoxazole derivative and any one or more of TCQn, $FeCl_3$, $C_{60}$, and $F_4$TCNQ may be included.

As a hole transport material for forming the hole transport layer, an aromatic amine-based compound (in other words, the one having a benzene ring-nitrogen bond) is preferably used. For example, N,N'-bis(3-methylphenyl)-N,N'-diphenyl-[1,1'-biphenyl]-4,4'-diamine (hereinafter referred to as TPD) or a derivative thereof such as 4,4'-bis[N-(1-naphthyl)-N-phenyl-amino]-biphenyl (hereinafter referred to as α-NPD) is widely used. Also widely used is a star burst aromatic amine compound such as 4,4',4''-tris(N-carbazolyl)-triphenyl amine (hereinafter referred to as TCTA), 4,4',4''-tris (N,N-diphenyl-amino)-triphenyl amine (hereinafter referred to as TDATA), or 4,4',4''-tris[N-(3-methylphenyl)-N-phenyl-amino]-triphenyl amine (hereinafter referred to as MTDATA).

As a light emitting material for forming the light emitting layer, various fluorescent pigments are specifically effective, in addition to a metal complex such as tris(8-quinolinolato) aluminum (hereinafter referred to as $Alq_3$), tris(4-methyl-8-quinolinolato)aluminum (hereinafter referred to as $Almq_3$), bis(10-hydroxybenzo[h]-quinolinato)beryllium (hereinafter referred to as $BeBq_2$), bis(2-methyl-8-quinolinolato)(4-phenylphenolato)aluminum (hereinafter referred to as BAlq), bis[2-(2-hydroxyphenyl)-benzoxazolate]zinc (hereinafter referred to as $Zn(BOX)_2$), or bis[2-(2-hydroxyphenyl)-benzothiazolate]zinc (hereinafter referred to as $Zn(BTZ)_2$).

In the case of forming the light emitting layer in combination with a guest material, the following material can be used as the guest material: quinacridon, diethyl quinacridon (hereinafter referred to as DEQD), dimethyl quinacridon (hereinafter referred to as DMQD), rubrene, perylene, coumarin, coumarin 545T (hereinafter referred to as C545T), DPT, Co-6, PMDFB, BTX, ABTX, DCM, DCJT, or a triplet light emitting material (phosphorescent material) such as tris(2-phenylpyridine)iridium (hereinafter referred to as $Ir(ppy)_3$) or 2,3,7,8,12,13,17,18-octaethyl-21H,23H-porphyrin-platinum (hereinafter referred to as PtOEP).

As an electron transport material which can be used for the electron transport layer, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used, in addition to the above-mentioned metal complex such as $Alq_3$, $Almq_3$, bis(2-methyl-8-quinolinolato)(4-phenylphenolato)aluminum (abbreviated to BAlq), $BeBq_2$, $Zn(BOX)_2$, or $Zn(BTZ)_2$, or a metal complex such as tris(8-quinolinolato)gallium (abbreviated to $Gaq_3$) or bis(2-methyl-8-quinolinolato)-4-phenylphenolate-gallium (abbreviated to BGaq)

As an electron injection material for forming the electron injection layer, an ultrathin film of an insulating material, for example, alkali metal halide such as LiF or CsF, alkaline earth metal halide such as $CaF_2$, alkali metal oxide such as $Li_2O$, or the like is often specifically used. In addition, an alkali metal complex such as lithium acetylacetonate (abbreviated to Li(acac)), 8-quinolinolato-lithium (abbreviated to Liq), or the like is also effective. A benzoxazole derivative and any one or more of alkali metal, alkaline earth metal, and transition metal may be included.

Figure 12:
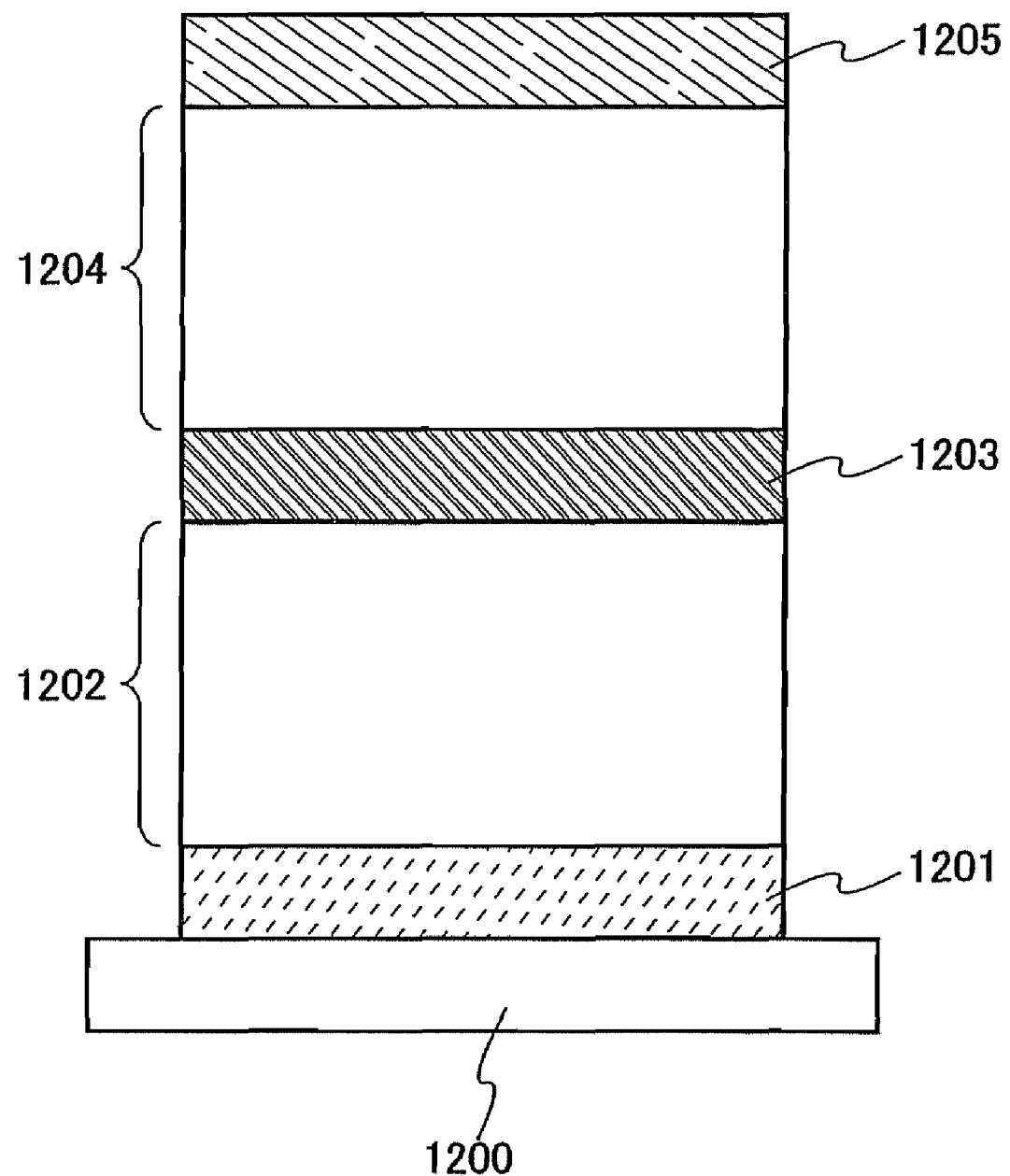
FIG. 12 shows an example of a layer including a light emitting material in a lighting device of the present invention.

Note that the layer including a light emitting material 103 may have a laminated structure of a plurality of layers each including a light emitting material. FIG. 12 shows an example of a laminated structure of a plurality of layers each including a light emitting material. FIG. 12 shows a structure in which a first electrode 1201, a first layer including a light emitting material 1202, a charge generation layer 1203, a second layer including a light emitting material 1204, and a second electrode 1205 are laminated over a substrate 1200. The charge generation layer 1203 needs to be formed of a highly light transmitting material having a function of injecting a carrier. Although FIG. 12 shows the laminated structure of the two layers each including a light emitting material, the invention is not limited thereto. A laminated structure of three or more layers each including a light emitting material may be used. Further, the first electrode is used as the electrode on the substrate side; however, the second electrode may be used as the electrode on the substrate side.

Luminance is improved by using the laminated structure of layers each including a light emitting material. The more layers are laminated, the more the luminance can be improved even with the same amount of current. In particular, the laminated structure of layers each including a light emitting material is suitable for lighting use which requires high luminance. In the case of forming the laminated structure of a plurality of layers each including a light emitting material, the layers each including a light emitting material may be formed of the same material or different materials.

For example, layers including a light emitting material formed of materials which emit red (R), green (G), and blue (B) light may be laminated, so that white light emission can be obtained as a whole. The light-emitting layers which emit red (R), green (G), and blue (B) light may each be formed by an evaporation method using an evaporation mask, a droplet discharge method (also referred to as an ink-jet method), or the like. Specifically, CuPC or PEDOT can be used for the hole injection layer; α-NPD, for the hole transport layer; BCP or $Alq_3$, for the electron transport layer; and BCP:Li or $CaF_2$, for the electron injection layer. The light emitting layer may be formed of, for example, a material doped with a dopant (DCM or the like in the case of R, or DMQD or the like in the case of G) corresponding to each light emission of R, and B. In the case of obtaining white light emission, not only the laminated structure of the light emitting materials of three colors as described above but also a laminated structure of light emitting materials of two colors may be used. For example, white light emission can be obtained by laminating materials which emit blue and yellow light.

Note that the structure of the layer including a light emitting material is not limited to the above-described laminated structure. For example, the layer including a light emitting material may be any one of a single layer type, a laminated type, and a mixed type with no interface between layers. A fluorescent material, a phosphorescent material, or a combined material thereof can be used. For example, a phosphorescent material can be used for the material which emits red (R) light, and a fluorescent material can be used for the materials which emit green (G) and blue (B) light. Further, any one of the following may be used: an organic material including a low molecular weight material, a high molecular weight material, and an intermediate molecular weight material, an inorganic material typified by molybdenum oxide which is superior in electron injecting properties, and a composite material of an organic material and an inorganic material.

The lighting device of the invention may be formed to provide not only white light but also desired-color light. A color filter, a color conversion layer, a combination of a color filter and a color conversion layer, or the like may be provided separately.

A second electrode 104 is formed over the layer including a light emitting material 103. A known material can be used for the second electrode 104. In the case of using the second electrode 104 as a cathode, a conductive material having a low work function is preferably used. Rare earth metal such as Yb or Er can be specifically used to form the cathode, in addition to alkali metal such as Li or Cs, alkaline earth metal such as Mg, Ca, or Sr, or an alloy including the metal (Mg:Ag, Al:Li, or the like). In the case of using an electron injection layer of LiF, CsF, $CaF_2$, $Li_2O$, or the like, a conductive thin film of aluminum or the like can be used. In the case of using the second electrode 104 as an anode, a conductive material having a high work function is preferably used. Specifically, a single-layer film of TiN, ZrN, Ti, W, Ni, Pt, Cr, or the like; a laminated layer of a titanium nitride film and a film containing aluminum as its main component; a three-layer structure of a titanium nitride film, a film containing aluminum as its main component, and a titanium nitride film; or the like can be used. Alternatively, the second electrode may be formed by laminating a transparent conductive film over a reflective electrode of Ti, Al, or the like.

An insulating film 105 is formed to cover the second electrode 104 and the layer including a light emitting material 103. The insulating film 105 electrically insulates the first electrode 102 and the second electrode 104 from the second electrode 104 and an auxiliary electrode 106, respectively. Note that the insulating film 105 may have a function as a protective film for preventing penetration of a substance, such as moisture and oxygen, to be the cause of promoting deterioration of the layer including a light emitting material.

The insulating film 105 has an opening 107, through which the first electrode 102 is electrically connected to the auxiliary electrode 106. A low-resistivity material is preferably used for the auxiliary electrode 106; specifically, a material such as aluminum, copper, or silver can be used. The diameter of the opening may be 10 μm to 500 μm, preferably, 50 μm to 200 μm.

A plurality of the openings 107 is provided in a light emitting region 108. An effect of voltage drop due to relatively high resistivity of the transparent conductive film can be reduced by electrically connecting the auxiliary electrode 106 to the first electrode 102 through the opening 107. In other words, the auxiliary electrode 106 practically lowers the resistivity of the first electrode 102 by being electrically connected to the first electrode 102 through the plurality of openings 107 formed in the light emitting region 108. This can reduce nonuniformity of luminance in which a portion away from a current supply terminal is dark. In the case where the size of the opening is sufficiently small, the presence of the auxiliary electrode can be, for the most part, disregarded when the lighting device is seen from the side of light emission, in other words, from the side of the light transmitting substrate. Since the auxiliary electrode is not placed in the direction of light emission, a material, a thickness, or a formation position of the auxiliary electrode can be freely set. Therefore, the auxiliary electrode can be selectively formed in a position where voltage tends to drop, or can be entirely formed over the light emitting region of the lighting device.

Since the lighting device of the invention can reduce the nonuniformity of luminance due to voltage drop caused by relatively high resistivity of the first electrode, a lighting device having favorable in-plane uniformity of luminance can be obtained. Specifically, the lighting device is preferably applied to a large-sized lighting device.

Embodiment Mode 2

Figure 5A:
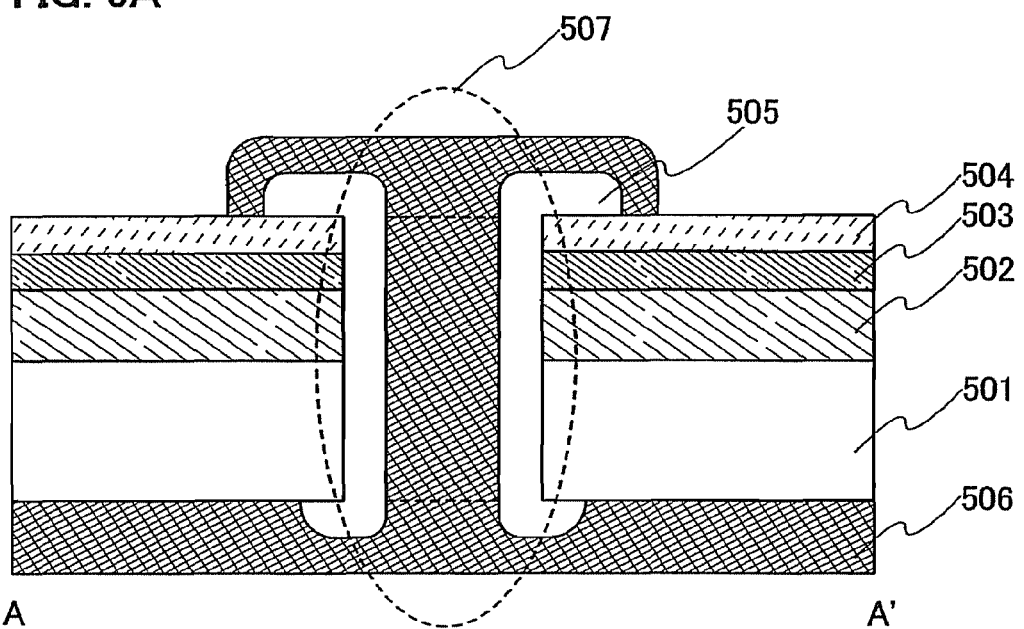
FIGS. 5A and 5B are a cross-sectional view and a top view of a light emitting region in a lighting device of the present invention, respectively.
Figure 5B:
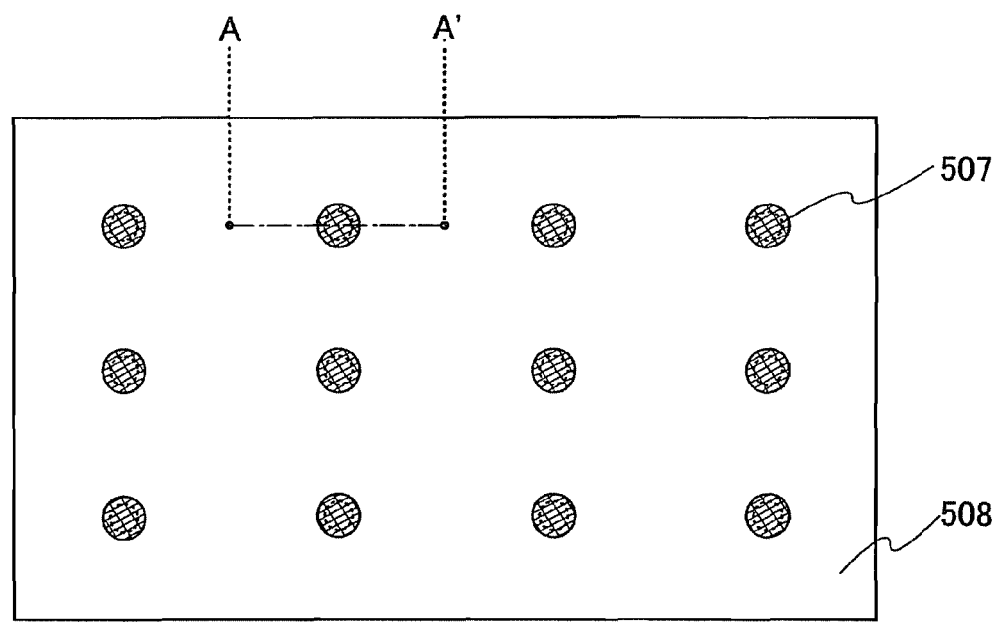

A structure of a lighting device of the invention is described with reference to FIGS. 5A and 5B. A lighting device shown in FIGS. 5A and 5B is a top emission lighting device which emits light from the opposite side of a substrate side. Note that FIG. 5B is a top view of a light emitting region of a lighting device and FIG. 5A is a cross-sectional view (taken along line A-A' in FIG. 5B) of the vicinity of an opening in the light emitting region.

In FIGS. 5A and 5B, a thin substrate formed of a flexible material is used as a substrate 501. Specifically, a flexible substrate such as a plastic substrate, more specifically a polyester film or an acrylic resin film, can be used.

A second electrode 502 is formed over the substrate 501. A known material can be used for the second electrode 502. In the case of using the second electrode 502 as a cathode, a conductive material having a low work function is preferably used. Rare earth metal such as Yb or Er can be used to form the cathode, in addition to alkali metal such as Li or Cs, alkaline earth metal such as Mg, Ca, or Sr, or an alloy including the metal (Mg:Ag, Al:Li, or the like). In the case of using an electron injection layer of LiF, CsF, $CaF_2$, or $Li_2O$, a typical conductive thin film of aluminum or the like can be used. In the case of using the second electrode 502 as an anode, a conductive material having a high work function is preferably used. Specifically, a single-layer film of TiN, ZrN, Ti, W, Ni, Pt, Cr, or the like; a laminated layer of a titanium nitride film and a film containing aluminum as its main component; a three-layer structure of a titanium nitride film, a film containing aluminum as its main component, and a titanium nitride film can be used. Alternatively, the second electrode may be formed by laminating a transparent conductive film over a reflective electrode of Ti, Al, or the like.

A layer including a light emitting material 503 is formed over the second electrode 502. A known material can be used for the layer including a light emitting material 503, and either a low molecular weight material or a high molecular weight material can be used. A material for forming, the layer including a light emitting material may include not only the one formed of only an organic compound material but also the one partly containing an inorganic compound. The layer including a light emitting material is formed by appropriately combining a hole injection layer, a hole transport layer, a hole blocking layer, a light emitting layer, an electron transport layer, an electron injection layer, or the like. The layer including a light emitting material may be a single layer or have a laminated structure of a plurality of layers.

Note that the layer including a light emitting material 503 may have a laminated structure of a plurality of layers each including a light emitting material. Luminance is improved by using the laminated structure of layers each including a light emitting material. The more layers are laminated, the more the luminance can be improved even with the same amount of current. In particular, the laminated structure of layers each including a light emitting material is suitable for lighting use which requires high luminance. In the case of forming the laminated structure of a plurality of layers each including a light emitting material, the layers each including a light emitting material may be formed of the same material or different materials.

A transparent conductive film is formed over the layer including a light emitting material 503 as a first electrode 504. For example, indium tin oxide (hereinafter referred to as ITO), indium tin oxide containing silicon, indium oxide containing zinc oxide (ZnO) of 2% to 20%, or the like can be used for the transparent conductive film.

The substrate 501, the second electrode 502, the layer including a light emitting material 503, and the first electrode 504 have an opening 507. An insulating film 505 is formed to cover the vicinity of the opening of the first electrode 504 and the substrate 501 and a side wall of the opening. The insulating film 505 electrically insulates the first electrode 504 and the second electrode 502 from the second electrode 502 and an auxiliary electrode 506, respectively. Note that the insulating film 505 may have a function as a protective film for preventing penetration of a substance, such as moisture and oxygen, to be the cause of promoting deterioration of the layer including a light emitting material.

The auxiliary electrode 506 is formed over a lower surface of the substrate, in the opening, and in the vicinity of the opening of the first electrode, and is electrically connected to the first electrode in the vicinity of the opening. A low-resistivity material is preferably used for the auxiliary electrode 506; specifically, a material such as aluminum, copper, or silver can be used. The diameter of the opening may be 10 μm to 500 μm, preferably, 50 μm to 200 μm.

A plurality of the openings 507 is provided in a light emitting region 508. An effect of voltage drop due to relatively high resistivity of the transparent conductive film can be reduced by electrically connecting the auxiliary electrode 506 to the first electrode 504 through the opening 507. In other words, the auxiliary electrode 506 practically lowers the resistivity of the first electrode 504 by being electrically connected to the first electrode 504 through the plurality of the openings 507 formed in the light emitting region 508. This can reduce nonuniformity of luminance in which a portion away from a current supply terminal is dark. In the case where the size of the opening is sufficiently small, the presence of the auxiliary electrode can be, for the most part, disregarded when the lighting device is seen from the side of light emission, in other words, from the side of a light transmitting substrate. Since the auxiliary electrode is not placed in the direction of light emission, a material, a thickness, or a formation position of the auxiliary electrode can be freely set. Therefore, the auxiliary electrode can be selectively formed in a position where voltage tends to drop, or can be entirely formed over the light emitting region of the lighting device.

Since the lighting device of the invention can reduce in-plane nonuniformity of luminance which is caused by voltage drop due to relatively high resistivity of the first electrode, a lighting device having favorable in-plane uniformity of luminance can be obtained. Specifically, the lighting device is preferably applied to a large-sized lighting device.

Embodiment 1

A method for manufacturing the lighting device of the invention shown in FIGS. 1A and 1B is described in this embodiment with reference to FIGS. 2A to 2D.

A transparent conductive film serving as a first electrode 202 is formed over a light transmitting substrate 201. In this embodiment, a glass substrate is used as the light transmitting substrate 201 and an ITO film is formed for forming the first electrode 202.

A layer including a light emitting material 203 is formed over the first electrode 202. A known material can be used for the layer including a light emitting material 203. The layer including a light emitting material may have a laminated structure of a plurality of layers each including a light emitting material.

Figure 2A:
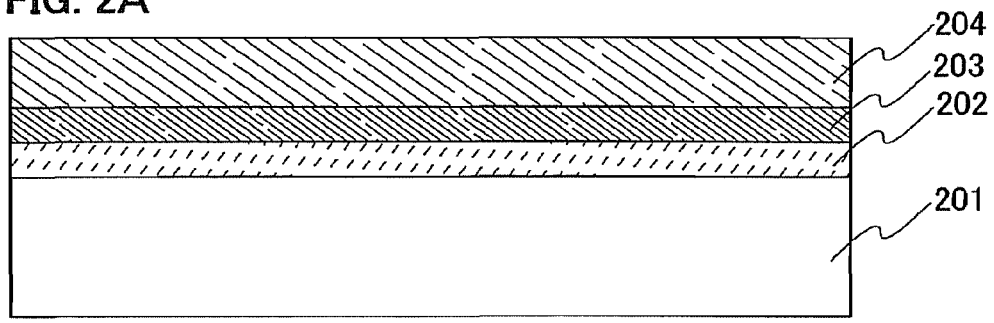
FIGS. 2A to 2D show a method for manufacturing a lighting device of the present invention.
Figure 2B:
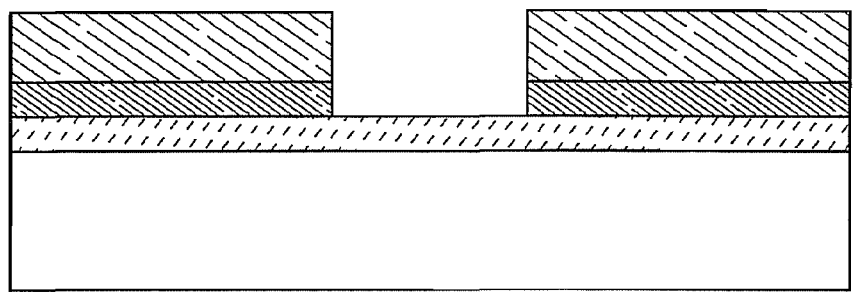

A second electrode 204 is formed over the layer including a light emitting material 203 (FIG. 2A). The second electrode 204 has an opening. After the second electrode is entirely formed over the layer including a light emitting material, the opening may be formed by pattering the second electrode by a photolithography method. Alternatively, the second electrode 204 having the opening may be formed by using a mask. In this embodiment, an aluminum film is used as the second electrode 204. After the second electrode is entirely formed over the layer including a light emitting material 203, it is patterned by a photolithography method. Thereafter, the opening is formed in the layer including a light emitting material, using the patterned second electrode as a mask (FIG. 2B).

Figure 2C:
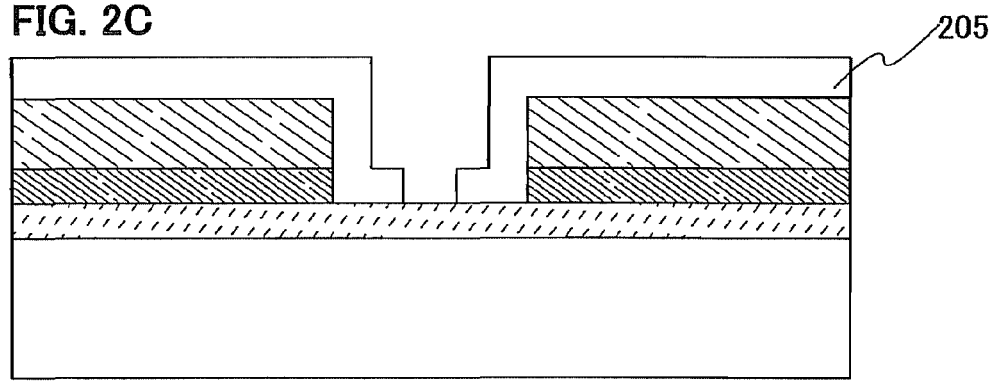

An insulating film 205 is formed to cover the layer including a light emitting material 203 and the second electrode 204 (FIG. 2C). The insulating film 205 also has an opening. After the insulating film is entirely formed, the opening may be formed by patterning the insulating film by a photolithography method. Alternatively, the insulating film may be formed by using a mask. In this embodiment, a silicon oxide film is used as the insulating film 205.

Figure 2D:
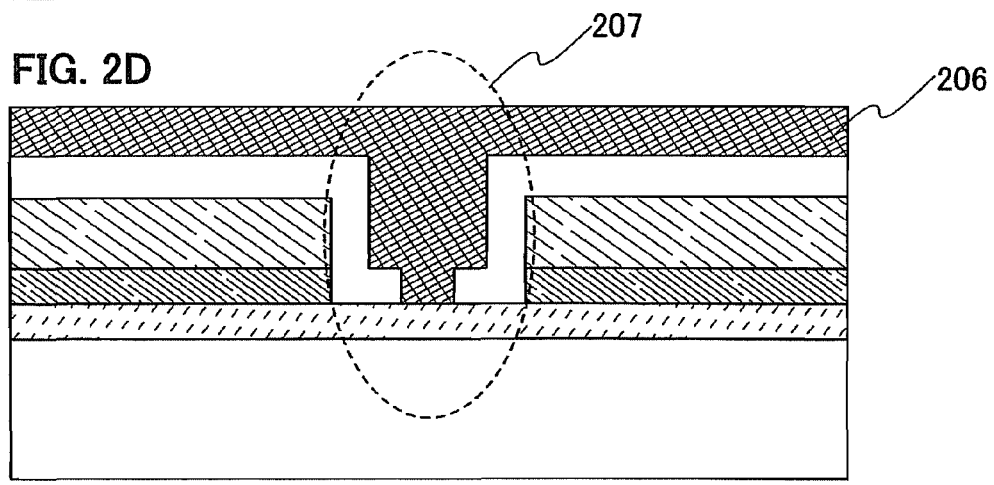

An auxiliary electrode 206 is formed (FIG. 2D). The auxiliary electrode 206 preferably has low resistivity, and aluminum is used in this embodiment. The auxiliary electrode 206 is electrically connected to the first electrode 202 through an opening 207 and insulated from the second electrode 204.

Thus, the ITO film serving as the first electrode 202 is connected to the auxiliary electrode 206 through the opening 207, and an effect of voltage drop due to relatively high resistivity of the first electrode can be reduced. Therefore, in-plane nonuniformity of luminance can be reduced when the lighting device is applied to a large-sized lighting device. In the case where the opening 207 is sufficiently small, the presence of the auxiliary electrode can be, for the most part, disregarded when the lighting device is seen from the side of light emission, in other words, from the side of the light transmitting substrate.

In this embodiment, the layer including a light emitting material is entirely formed and then patterned using aluminum as a mask. However, the layer including a light emitting material may be formed using a mask to have an opening.

Figure 3A:
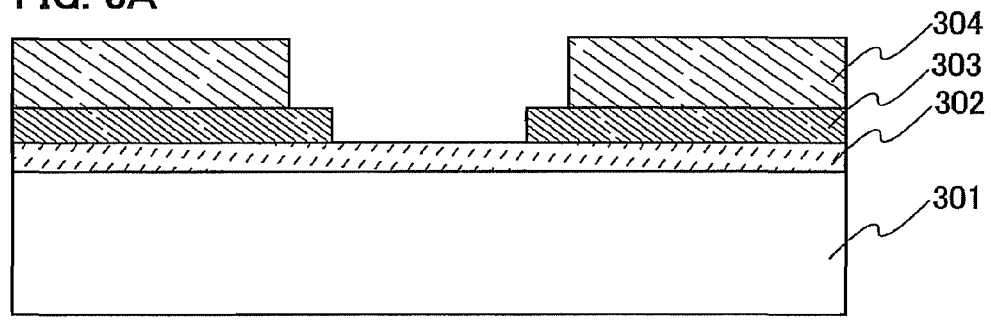
FIGS. 3A to 3C show a method for manufacturing a lighting device of the present invention.
Figure 3B:
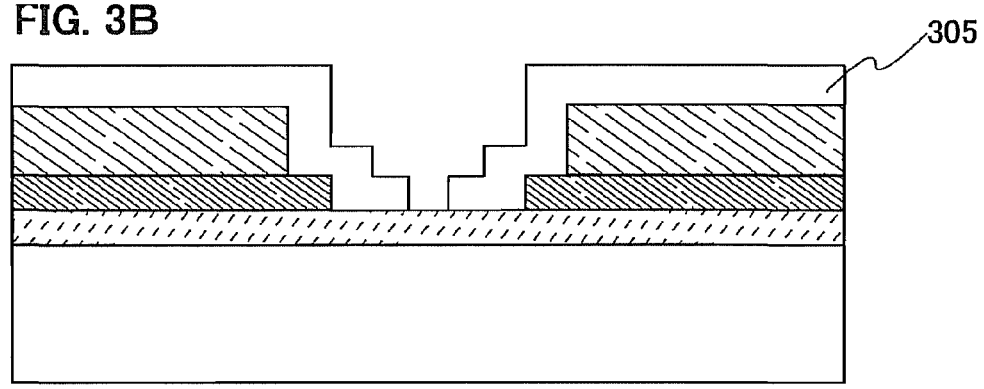
Figure 3C:
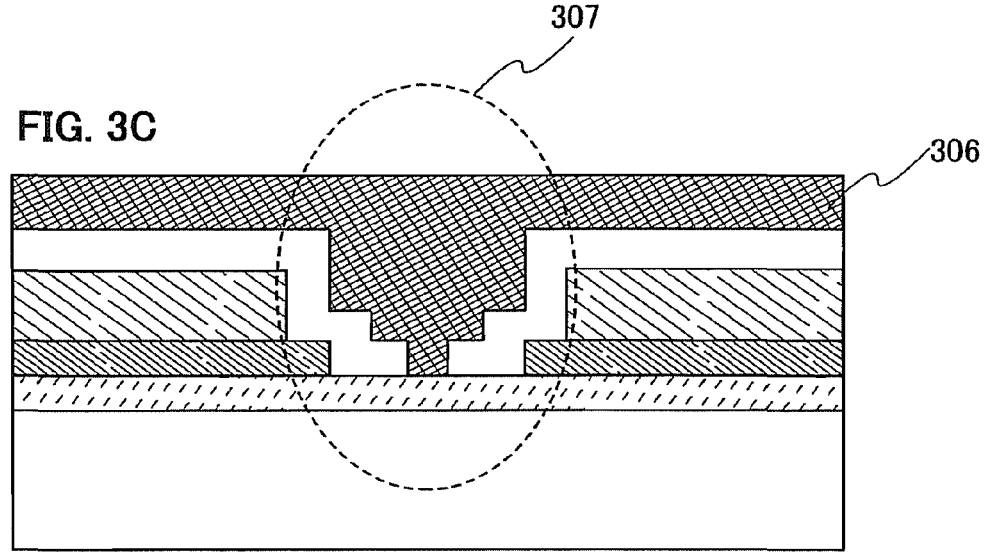

FIGS. 3A to 3C show a method for forming each of a layer including a light emitting material 303 and a second electrode 304 using a mask. In other words, each of the layer including a light emitting material 303 and the second electrode 304 is formed using a mask after a first electrode 302 is entirely formed. An insulating film 305, an auxiliary electrode 306, and an opening 307 may be formed by a similar method to the above-described method. At this time, the first electrode is more certainly insulated from the second electrode by making the opening of the second electrode 304 larger than that of the layer including a light emitting material 303.

Embodiment 2

Figure 4A:
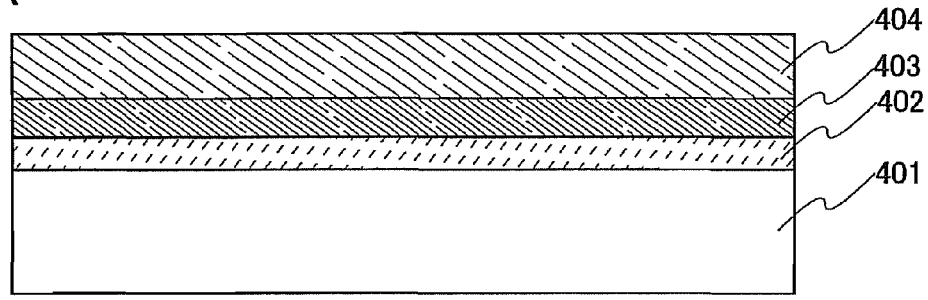
FIGS. 4A to 4C show a method for manufacturing a lighting device of the present invention.
Figure 4B:
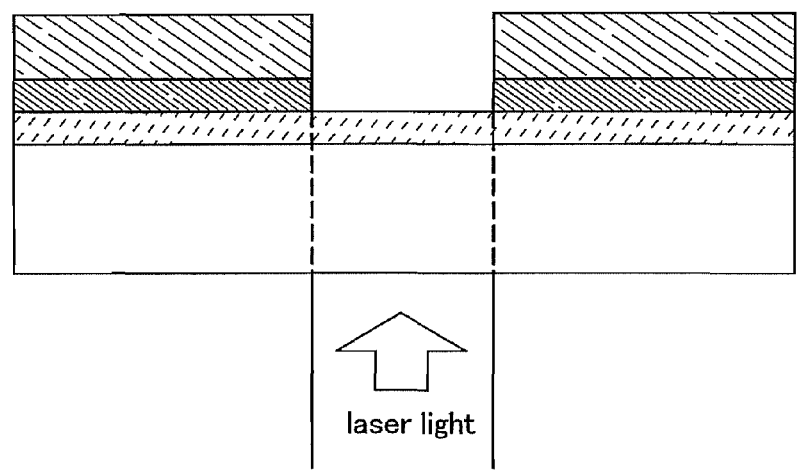
Figure 4C:
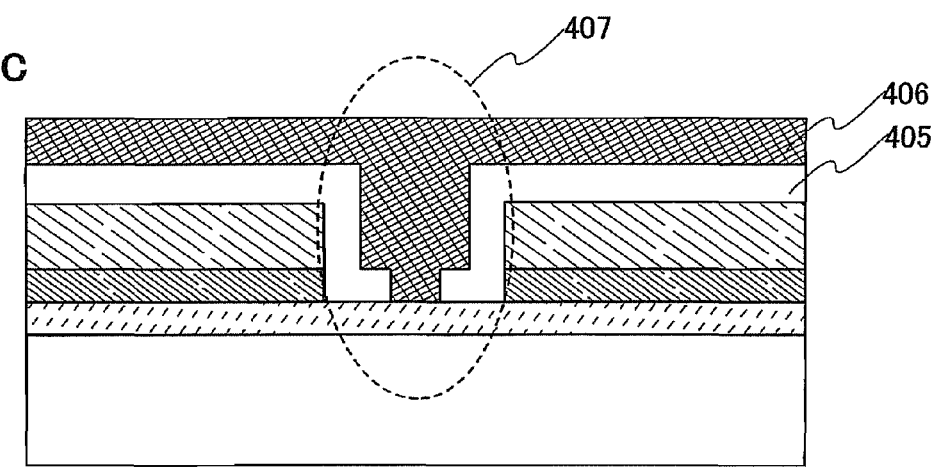

A method for manufacturing the lighting device of the invention shown in FIGS. 1A and 1B, which is different from that of Embodiment 1, is described in this embodiment with reference to FIGS. 4A to 4C.

A transparent conductive film serving as a first electrode 402 is formed over a light transmitting substrate 401. In this embodiment, a glass substrate is used as the light transmitting substrate 401 and an ITO film is formed as the first electrode 402.

A layer including a light emitting material 403 and a second electrode 404 are sequentially formed (FIG. 4A). In this embodiment, an aluminum film is formed for the second electrode 404.

Then, laser light is emitted to the light transmitting substrate 401 side to form an opening (FIG. 4B). As the laser light, used is laser light with a wavelength enough to be transmitted through the glass substrate and ITO and absorbed by the layer including a light emitting material 403 and the second electrode 404. In this embodiment, laser light with a wavelength of 532 nm is used. The laser light with a wavelength of 532 nm can be obtained by converting a fundamental wave (wavelength: 1064 nm) of a YAG laser, $YVO_4$, or the like into a second harmonic by a nonlinear optical element. The layer including a light emitting material and the second electrode after absorbing the laser light are heated and sublimed, thereby forming the opening. After the opening is formed, an insulating film 405 and an auxiliary electrode 406 are formed as in Embodiment 1 so that the first electrode 402 is electrically connected to the auxiliary electrode 406 through the opening 407 (FIG. 4C).

Embodiment 3

A method for manufacturing the lighting device of the invention shown in FIGS. 5A and 5B is described in this embodiment with reference to FIGS. 6A to 6C and FIGS. 7A and 7B.

Figure 6A:
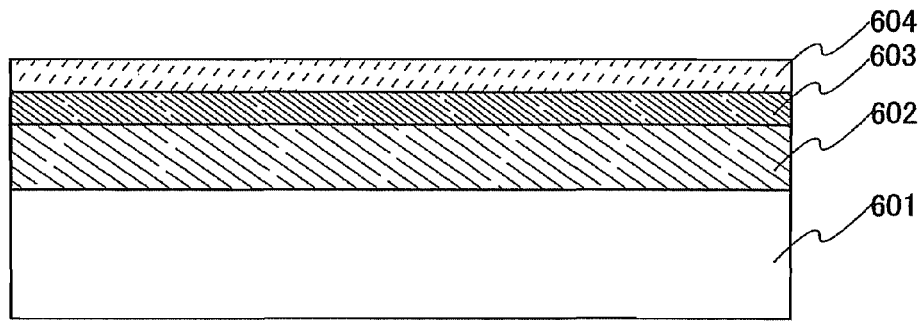
FIGS. 6A to 6C show a method for manufacturing a lighting device of the present invention.

A second electrode 602, a layer including a light emitting material 603, and a first electrode 604 are formed over a thin substrate 601 formed of a flexible material. In this embodiment, an aluminum film is formed as the second electrode 602 and an ITO film is formed as the first electrode 604 over a polyester film (FIG. 6A).

Figure 6B:
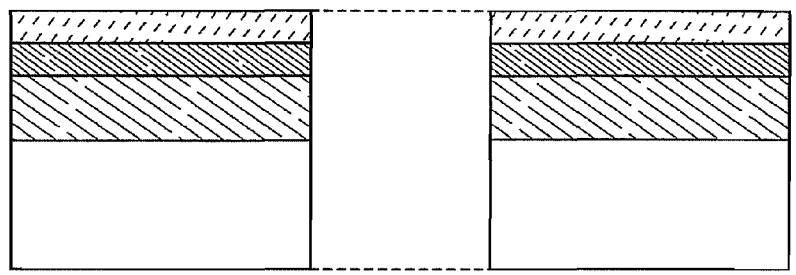

The substrate 601, the second electrode 602, the layer including a light emitting material 603, and the first electrode 604 are provided with an opening (FIG. 6B). Since the substrate 601 is formed of a flexible material, the opening can be easily formed by applying physical force.

Figure 6C:
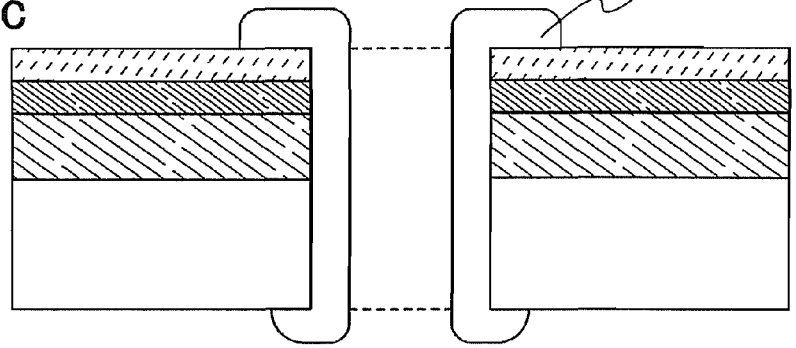

A silicon oxide film is formed as an insulating film 605. The silicon oxide film is formed using a mask by a sputtering method or an evaporation method (FIG. 6C). The silicon oxide film is also formed to wrap around to the opposite surface of an intended surface through the opening by using a sputtering method or an evaporation method. According to this, the second electrode 602 is more certainly insulated from an auxiliary electrode 606.

Figure 7A:
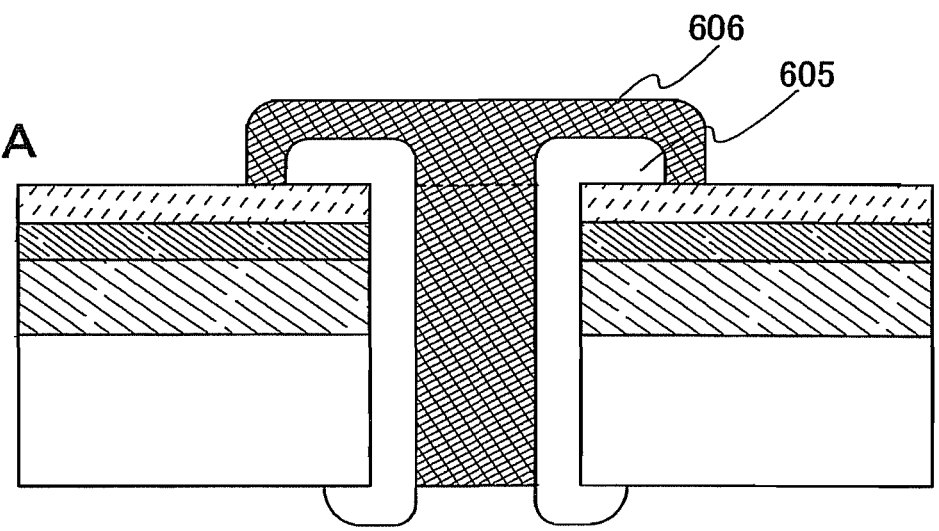
FIGS. 7A and 7B show a method for manufacturing a lighting device of the present invention.
Figure 7B:
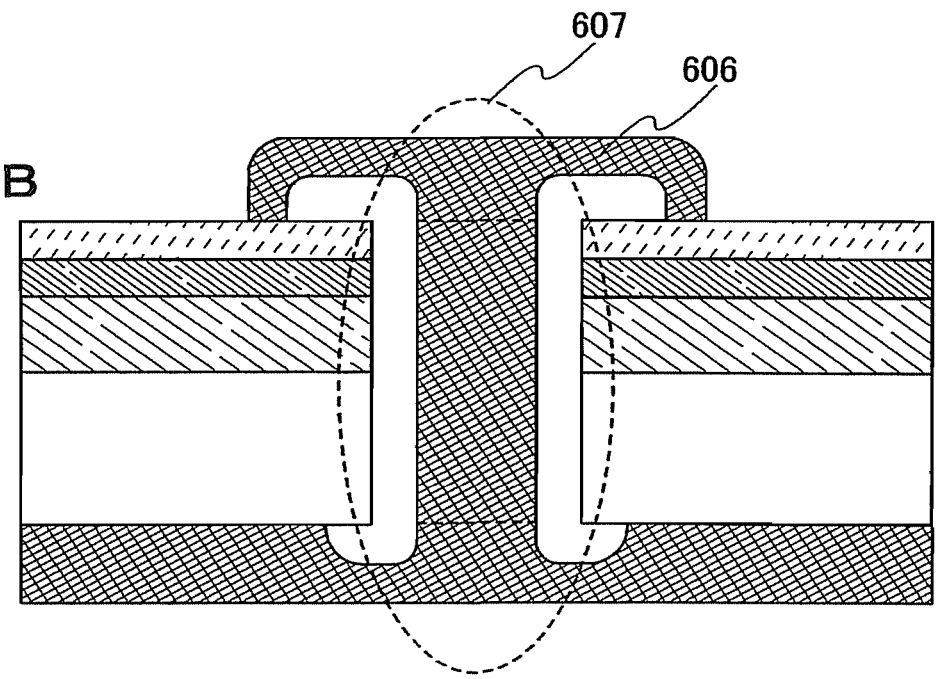

The auxiliary electrode 606 is formed. First, silver is deposited on the first electrode 604 side by a printing method. With the use of a printing method at this time, the opening 607 is filled with silver (FIG. 7A). Then, silver is entirely deposited on the substrate 601 side (FIG. 7B). According to this, the first electrode 604 is electrically connected to the auxiliary electrode 606. Thus, an effect of voltage drop due to relatively high resistivity of the first electrode can be reduced. Therefore, a lighting device having favorable in-plane uniformity of luminance can be obtained when the lighting device is applied to a large-sized lighting device.

In the structure of this embodiment, an ITO film serving as the first electrode is connected to the auxiliary electrode formed of silver, on a light emitting side. However, in the case where the opening 607 is sufficiently small, the presence of the auxiliary electrode can be, for the most part, disregarded when the lighting device is seen from the side of light emission, in other words, from the side of the first electrode.

Embodiment 4

An example of an overall structure of a lighting device of the invention is described in this embodiment with reference to FIGS. 8A and 8B.

FIGS. 8A and 8B are a top view and a cross-sectional view of a lighting device of the invention, respectively. The lighting device of the invention includes a substrate 801, a first electrode 802, a layer including a light emitting material 803, a second electrode 804, an insulating film 805, and an auxiliary electrode 806. The first electrode 802 is electrically connected to the auxiliary electrode 806 through an opening 807. A plurality of the openings 807 is provided in a light emitting region. A second insulating film 808 is at the end of the light emitting region, which serves to prevent the first electrode 802 and the second electrode 804 from shorting. Current supply terminals 809 are each connected to the second electrode 804 and the auxiliary electrode 806. The light emitting region is sealed with a sealant 810. The sealant is preferably a material which let penetrate as little moisture and oxygen as possible to prevent deterioration of the layer including a light emitting material. A space 811 surrounded by the sealant is filled with a filler. The space 811 surrounded by the sealant may be filled with an inert gas (nitrogen, argon, or the like) in place of the filler. Alternatively, the space may be filled with a sealant.

FIGS. 8A and 8B show the structure described in Embodiment 1 as an example; however, the structure described in Embodiment 2 or 3 can also be used as a lighting device by sealing similarly.

Embodiment 5

Examples of a device using a lighting device of the invention are described in this embodiment with reference to FIG. 9 and FIGS. 10A to 10C.

Figure 9:
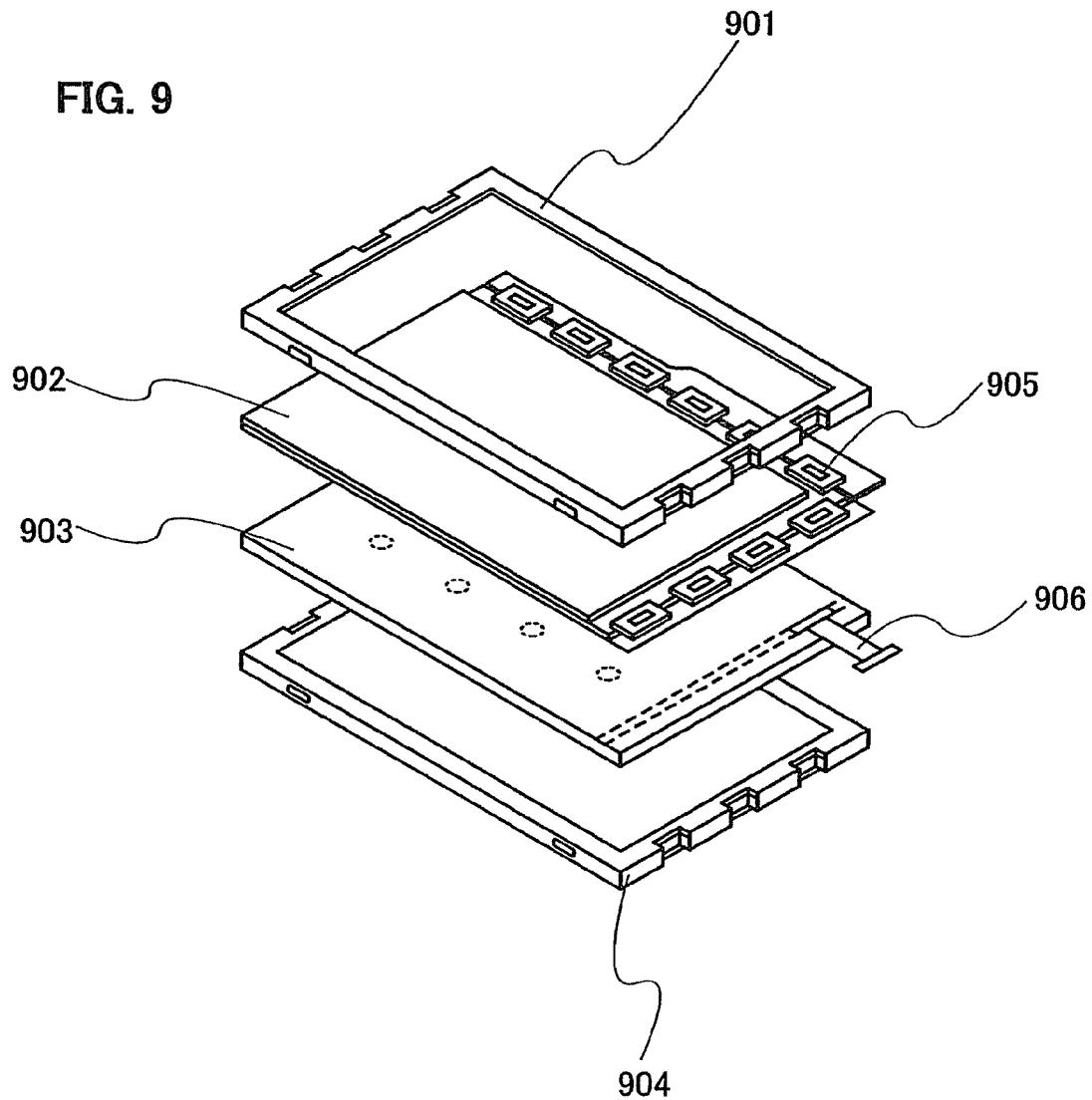
FIG. 9 shows an example of a device using a lighting device of the present invention.

FIG. 9 shows an example of a liquid crystal display device using a lighting device of the invention as a backlight. The liquid crystal display device shown in FIG. 9 includes a chassis 901, a liquid crystal layer 902, a backlight 903, and a chassis 904. The liquid crystal layer 902 is connected to a driver IC 905. The lighting device of the invention is used as the backlight 903 and current is supplied through a terminal 906.

A backlight having favorable in-plane uniformity of luminance can be obtained by using the lighting device of the invention as a backlight of a liquid crystal display device; thus, high quality of a display device is obtained. Since the backlight can have large area, the liquid crystal display device can also have large area. Further, the light emitting element is thin and consumes low power; therefore, the display device can also be thinned and made to consume low power.

Figure 10A:
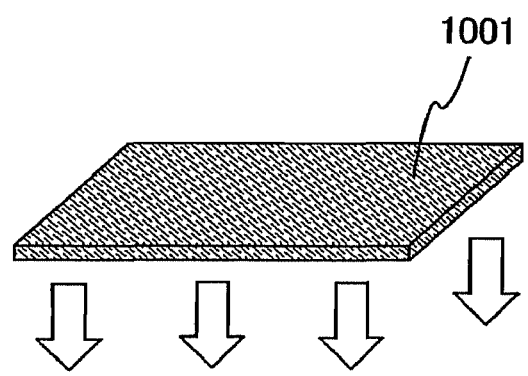
FIGS. 10A to 10C show examples of a device using a lighting device of the present invention.

FIG. 10A shows the lighting device of the invention used as indoor lighting. The lighting device of the invention is a surface-emitting lighting device and has favorable in-plane uniformity of luminance even when it has large area. Therefore, an entire ceiling, for example, can be provided with the lighting device of the invention. Not only the ceiling but also a wall, a floor, or a column can be provided with the lighting device of the invention. Further, the lighting device of the invention can be provided on a curved surface because the lighting device is flexible. Moreover, the lighting device can be used not only indoors but also outdoors and can be provided on a building wall or the like as an outdoor light.

Figure 10B:
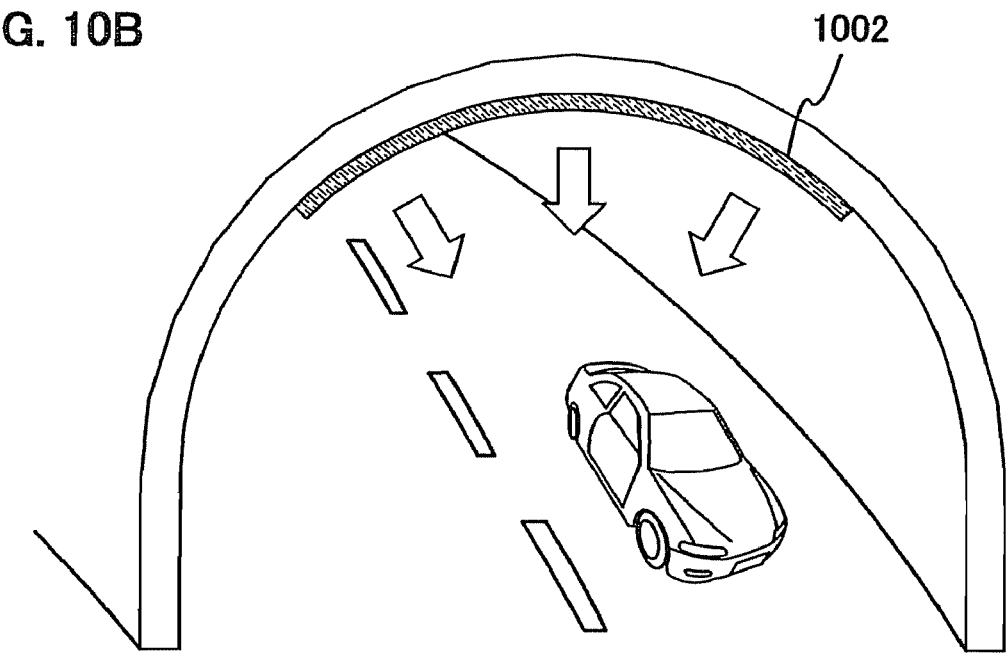

FIG. 10B shows the lighting device of the invention used as lighting in a tunnel. The lighting device of the invention can be formed along a curved inner wall of a tunnel because the lighting device is flexible.

Figure 10C:
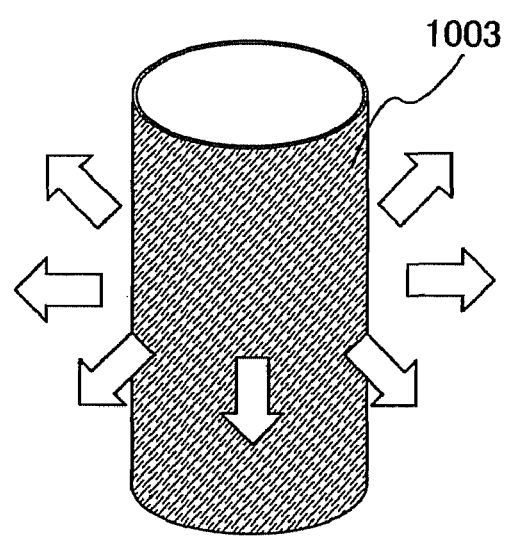

FIG. 10C shows an example of the lighting device of the invention used as interior lighting. Since the lighting device of the invention is thin and flexible and is a surface-emitting type, it can be processed into a desired shape as shown in FIG. 10B.

The lighting device of the invention can also be used for lighting in taking a picture. In the case of taking a picture, a picture similar to one taken with a subject illuminated by natural light can be taken when a subject is illuminated by large-sized light with uniform luminance.

What is claimed is:

1. A lighting device comprising:
   a first electrode over a substrate;
   a layer including a light emitting material over the first electrode;
   a second electrode over the layer including a light emitting material;
   a third electrode over the first electrode, and electrically connected to the first electrode; and
   an insulating layer over the first electrode, and between the layer including a light emitting material and the third electrode,
   wherein the third electrode is isolated from the second electrode and the layer including a light emitting material,
   wherein the layer including a light emitting material comprises:
   a first layer including a first light emitting material;
   a second layer including a second light emitting material; and
   a charge generation layer provided between the first layer and the second layer, and
   wherein a resistivity of the third electrode is lower than that of the first electrode.

2. A lighting device according to claim 1, wherein the first electrode comprises a transparent conductive film.

3. A lighting device according to claim 1, wherein the first electrode comprises a substance selected from the group consisting of indium tin oxide, indium tin oxide including silicon, and indium oxide including zinc oxide.

4. A lighting device according to claim 1, wherein the first electrode comprises a substance selected from the group consisting of indium tin oxide, indium tin oxide including silicon, and indium oxide including zinc oxide.

5. A lighting device according to claim 1, wherein the first electrode comprises a substance selected from the group consisting of indium tin oxide, indium tin oxide including silicon, and indium oxide including zinc oxide.

6. A lighting device according to claim 1, wherein the layer including a light emitting material comprises an organic compound or an inorganic compound.

7. A lighting device according to claim 1, wherein the insulating layer comprises a substance selected from the group consisting of siloxane, acrylic and polyimide.

8. A lighting device according to claim 1, wherein the third electrode comprises a substance selected from the group consisting of aluminum and copper.

9. A lighting device according to claim 1, wherein the lighting device emits white light.

10. A lighting device comprising:
a first electrode over a substrate;
a layer including a light emitting material over the first electrode;
a second electrode over the layer including a light emitting material;
a third electrode over the first electrode, and electrically connected to the first electrode; and
an insulating layer over the first electrode, and between the layer including a light emitting material and the third electrode,
wherein the third electrode is isolated from the second electrode and the layer including a light emitting material,
wherein the layer including a light emitting material comprises:
a first layer including a first light emitting material;
a second layer including a second light emitting material over the first layer; and
a third layer including a third light emitting material over the second layer, and
wherein a resistivity of the third electrode is lower than that of the first electrode.

11. A lighting device according to claim 10, wherein the first electrode comprises a transparent conductive film.

12. A lighting device according to claim 10, wherein the layer including a light emitting material comprises an organic compound or an inorganic compound.

13. A lighting device according to claim 10, wherein the insulating layer comprises a substance selected from the group consisting of siloxane, acrylic and polyimide.

14. A lighting device according to claim 10, wherein the third electrode comprises a substance selected from the group consisting of aluminum and copper.

15. A lighting device according to claim 10, wherein the lighting device emits white light.

16. A lighting device comprising:
a first electrode over a substrate;
a layer including a light emitting material over the first electrode;
a second electrode over the layer including a light emitting material;
a third electrode over the first electrode, and electrically connected to the first electrode; and
an insulating layer over the first electrode, and between the layer including a light emitting material and the third electrode,
wherein the third electrode is isolated from the second electrode and the layer including a light emitting material,
wherein a resistivity of the third electrode is lower than that of the first electrode, and
wherein the insulating layer is in contact with the first electrode, the layer including a light emitting material, and the second electrode.

17. A lighting device according to claim 16, wherein the first electrode comprises a transparent conductive film.

18. A lighting device according to claim 16, wherein the layer including a light emitting material comprises an organic compound or an inorganic compound.

19. A lighting device according to claim 16, wherein the insulating layer comprises a substance selected from the group consisting of siloxane, acrylic and polyimide.

20. A lighting device according to claim 16, wherein the third electrode comprises a substance selected from the group consisting of aluminum and copper.

21. A lighting device according to claim 16, wherein the lighting device emits white light.

22. A lighting device comprising:
a first electrode over a substrate;
a layer including a light emitting material over and in contact with the first electrode;
a second electrode over and in contact with the layer including a light emitting material;
a third electrode over and in contact with the first electrode; and
an insulating layer between the layer including a light emitting material and the third electrode,
wherein the insulating layer is in contact with the layer including a light emitting material and the third electrode, and
wherein a resistivity of the third electrode is lower than that of the first electrode.

23. A lighting device according to claim 22, wherein the first electrode comprises a transparent conductive film.

24. A lighting device according to claim 22, wherein the first electrode comprises a substance selected from the group consisting of indium tin oxide, indium tin oxide including silicon, and indium oxide including zinc oxide.

25. A lighting device according to claim 22, wherein the layer including a light emitting material comprises an organic compound or an inorganic compound.

26. A lighting device according to claim 22, wherein the insulating layer comprises a substance selected from the group consisting of siloxane, acrylic and polyimide.

27. A lighting device according to claim 22, wherein the third electrode comprises a substance selected from the group consisting of aluminum and copper.

28. A lighting device according to claim 22, wherein the lighting device emits white light.

29. A lighting device comprising:
a first electrode over a substrate;
a layer including a light emitting material over and in contact with the first electrode;
a second electrode over and in contact with the layer including a light emitting material;
a third electrode over and in contact with the first electrode; and
an insulating layer between the layer including a light emitting material and the third electrode,
wherein the insulating layer is in contact with the layer including a light emitting material and the third electrode, wherein the layer including a light emitting material comprises:
  a first layer including a first light emitting material;
  a second layer including a second light emitting material over the first layer; and
  a third layer including a third light emitting material over the second layer, and
wherein a resistivity of the third electrode is lower than that of the first electrode.

30. A lighting device according to claim 29, wherein the first electrode comprises a transparent conductive film.

31. A lighting device according to claim 29, wherein the first electrode comprises a substance selected from the group consisting of indium tin oxide, indium tin oxide including silicon, and indium oxide including zinc oxide.

32. A lighting device according to claim 29, wherein the layer including a light emitting material comprises an organic compound or an inorganic compound.

33. A lighting device according to claim 29, wherein the insulating layer comprises a substance selected from the group consisting of siloxane, acrylic and polyimide.

34. A lighting device according to claim 29, wherein the third electrode comprises a substance selected from the group consisting of aluminum and copper.

35. A lighting device according to claim 29, wherein the lighting device emits white light.

36. A lighting device comprising:
  a first electrode over a substrate;
  a layer including a light emitting material over and in contact with the first electrode;
  a second electrode over and in contact with the layer including a light emitting material;
  a third electrode over and in contact with the first electrode;
  an insulating layer between the layer including a light emitting material and the third electrode; and
  a sealant over the third electrode;
wherein the insulating layer is in contact with the layer including a light emitting material and the third electrode,
wherein a resistivity of the third electrode is lower than that of the first electrode.

37. A lighting device according to claim 36, wherein the first electrode comprises a transparent conductive film.

38. A lighting device according to claim 36, wherein the first electrode comprises a substance selected from the group consisting of indium tin oxide, indium tin oxide including silicon, and indium oxide including zinc oxide.

39. A lighting device according to claim 36, wherein the layer including a light emitting material comprises an organic compound or an inorganic compound.

40. A lighting device according to claim 36, wherein the insulating layer comprises a substance selected from the group consisting of siloxane, acrylic and polyimide.

41. A lighting device according to claim 36, wherein the third electrode comprises a substance selected from the group consisting of aluminum and copper.

42. A lighting device according to claim 36, wherein the lighting device emits white light.

* * * * *